United States Patent
Gopal et al.

(10) Patent No.: US 9,929,748 B1
(45) Date of Patent: Mar. 27, 2018

(54) TECHNIQUES FOR DATA COMPRESSION VERIFICATION

(71) Applicant: INTEL CORPORATION, Santa Clara, CA (US)

(72) Inventors: Vinodh Gopal, Westborough, MA (US); James D. Guilford, Northborough, MA (US); Kirk S. Yap, Westborough, MA (US); Daniel F. Cutter, Maynard, MA (US); Wajdi K. Feghali, Boston, MA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/476,945

(22) Filed: Mar. 31, 2017

(51) Int. Cl.
  *H03M 7/40* (2006.01)
  *H03M 7/30* (2006.01)
  *H04L 1/24* (2006.01)

(52) U.S. Cl.
  CPC ....... *H03M 7/6041* (2013.01); *H03M 7/3086* (2013.01); *H03M 7/6005* (2013.01); *H03M 7/6011* (2013.01); *H04L 1/24* (2013.01)

(58) Field of Classification Search
  CPC ............. H03M 7/6041; H03M 7/3086; H03M 7/6005; H03M 7/6011
  USPC ..................................................... 341/60–70
  See application file for complete search history.

(56) References Cited

U.S. PATENT DOCUMENTS

| | | | |
|---|---|---|---|
| 6,886,161 B1* | 4/2005 | Garvin | G06F 8/70 717/175 |
| 7,394,573 B1* | 7/2008 | Goldberg | G06T 1/0042 358/1.15 |
| 7,688,233 B2* | 3/2010 | Schneider | H03M 7/3086 341/107 |
| 2004/0068658 A1* | 4/2004 | Arisaka | G06Q 20/401 713/176 |
| 2007/0294686 A1* | 12/2007 | Oh | G06F 8/68 717/168 |
| 2009/0055422 A1* | 2/2009 | Williams | H03M 7/30 |
| 2014/0320996 A1* | 10/2014 | Hostetter | G11B 20/1816 360/53 |
| 2016/0248655 A1* | 8/2016 | Francisco | H04L 43/028 |

* cited by examiner

*Primary Examiner* — Lam T Mai

(57) ABSTRACT

Techniques and apparatus for verification of compressed data are described. In one embodiment, for example an apparatus to provide verification of compressed data may include at least one memory and logic, at least a portion of comprised in hardware coupled to the at least one memory, the logic to access compressed data, access compression information associated with the compressed data, decompress at least a portion of the compressed data to generate decompressed data, and verify the compressed data via a comparison of the decompressed data with the compression information. Other embodiments are described and claimed.

25 Claims, 8 Drawing Sheets

TECHNIQUES FOR DATA COMPRESSION VERIFICATION

TECHNICAL FIELD

Embodiments herein generally relate to information processing, and more particularly, to data compression and decompression techniques.

BACKGROUND

Computing and network systems rely on the use of compressed data in order to meet the demands of data storage and delivery. In general, compression processes may be employed to reduce the size of data without sacrificing the information contained within the data. Data consumers are required to decompress the compressed files before using the data. Errors introduced into compressed data during the compression processes may lead to corrupt data. Even a 1-bit error in a compressed bit stream may cause large portions of a compressed bit stream to be unusable by a data consumer. Conventional verification methods generally require decompressing the compressed data to verify that the compressed data matches the source data. Such techniques incur significant resource and time costs, particularly for large files. Accordingly, compression verification techniques are needed that are capable of providing efficient and accurate verification results.

DETAILED DESCRIPTION

Figure 1:
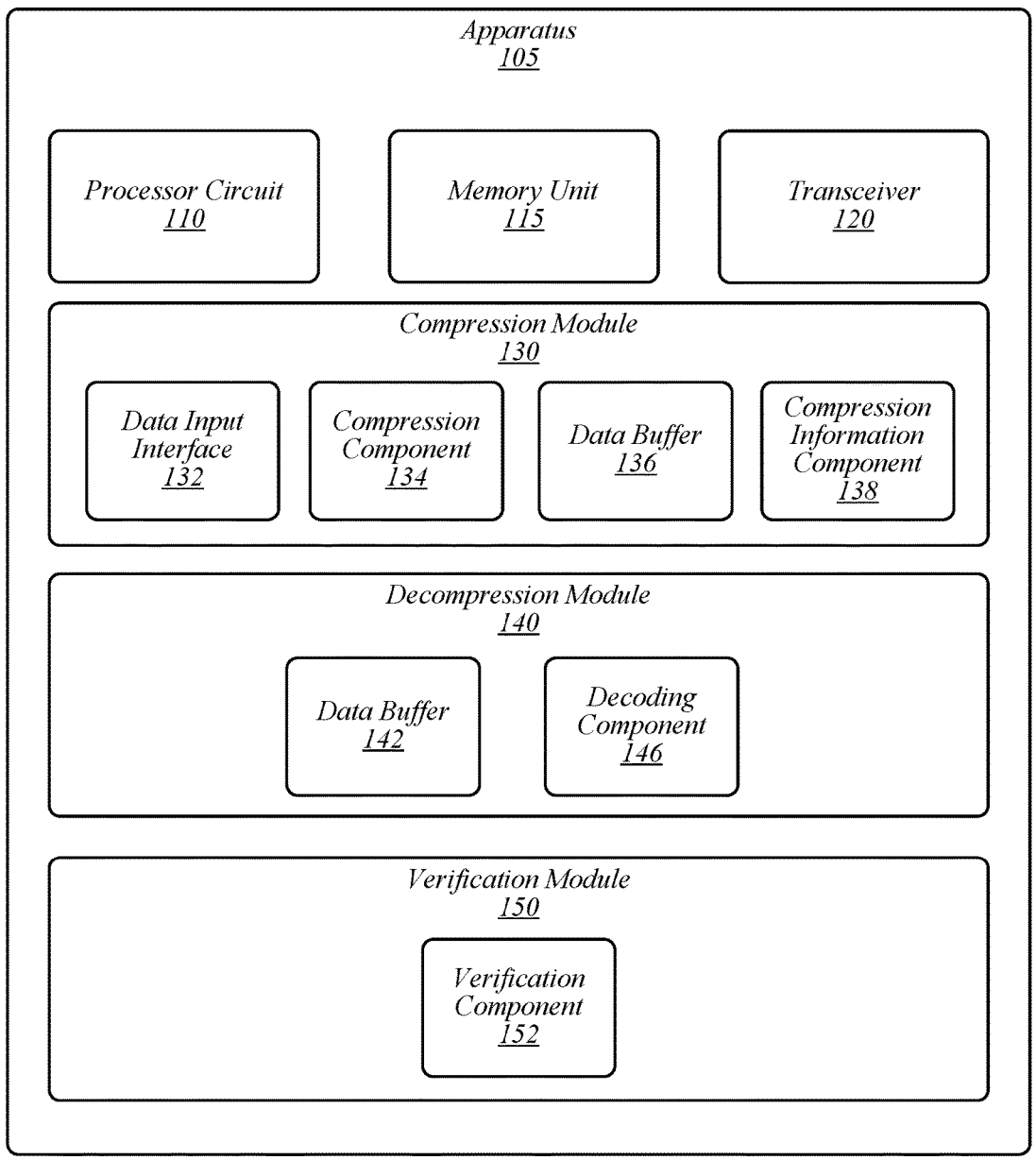
FIG. 1 illustrates an embodiment of a first operating environment.

Various embodiments may be generally directed to techniques for data compression and decompression provided by a computer system. In some embodiments, the computer system may be operative to perform a verification processes on compressed data to verify that the compressed data corresponds with source data. In some embodiments, a compression encoder may be configured to generate compressed data from the source data using a compression process. During the compression process, the compression encoder may generate compression information that includes information associated with the compressed data. In some embodiments, the compression information may include information that may be used to decompress the compressed data. In some embodiments, the compression information may include indicator information (or "hints") regarding symbols of the compressed data, such as a location of the symbols or at least a portion of the symbols. In various embodiments, a decompression module or component may include one or more decompression decoders operative to perform a compression-verification process. In some embodiments, the one or more decompression decoders may include a plurality of parallel decompression decoders. In various embodiments, the compression information ("hint stream" or "indicator stream") may be provided to the decompression module during or substantially during a compression process generating the compressed data. For example, a compression encoder configured according to some embodiments may generate the compression information during a compression process creating the compressed data. The compression encoder may provide the compression information and/or the compressed data to the decompression module. In some embodiments, the decompression module may include a decompression parser operative to use the indicator information to divide up incoming bits of a compressed data stream to generate a plurality of segments. In some embodiments, the plurality of segments may include segments based on symbols (for instance, "symbol segments"). In various embodiments, the plurality of segments may be provided to the one or more decompression decoders to be decoded in parallel (for instance, simultaneously or substantially simultaneously). In some embodiments, the decompression module, for instance, via the one or more decompression decoders, may verify that the decoded symbol size is consistent with the indicator information (for example, symbol location hints) of the compression information. If the decoded symbol size is not consistent with the indicator information, the decompression module may generate an alert, such as an "error," "corrupt data," or "mis-compare" alert, indicating that a bit stream is not valid and/or that the compression information is not valid.

For example, in an embodiment, an apparatus to provide verification of compressed data may include at least one memory and logic, at least a portion of comprised in hardware coupled to the at least one memory, the logic to access compressed data, access compression information associated with the compressed data, decompress at least a portion of the compressed data to generate decompressed data, and verify the compressed data via a comparison of the decompressed data with the compression information.

In general, conventional decompression techniques involve very sequential processes of decoding symbols in a compressed data stream. Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like. Decompression of Deflate-compressed files may be referred to as "Inflate." Although LZ77, LZ4, and Deflate are used as examples, embodiments are not so limited. In particular, compression processes capable of operating according to some embodiments are contemplated herein.

In general, the LZ77 compression process operates by replacing repeated occurrences of data with references to a single copy of that data existing earlier in the input (uncompressed) data stream. A match is encoded by a pair of numbers called a length-distance pair ("distance" may be referred to as an "offset"). As such, the LZ77 compression process finds repeated substrings and replaces them with backward references (relative distance offsets). The LZ77 compression process can use a reference to a duplicated string if the relative distance is less than the maximal history size defined in the algorithm encoding (for instance, 32 KB in Deflate). The compressed data consists of a series of elements of two types: literal bytes (copy of the data) and pointers to replicated strings, where a pointer is represented as the pair <length, backward distance>. The various algorithms in the LZ77 family all find LZ77 string matches during compression, but encode the literals or references differently (for instance, Huffman codes in Deflate, simple byte-oriented packing in Snappy, and/or the like), and have different maximal history windows. In general, a literal may include raw encoded data (as opposed to data encoded as a length, distance pair).

To spot matches, the LZ77 encoder keeps track of some amount of the most recent data, such as the last 2 kB, 4 kB, 32 kB, and/or the like. The structure in which this data is held is called a "sliding window" (accordingly, LZ77 may be referred to as "sliding window compression"). The encoder keeps the most recent data within the sliding window to look for matches (and the decoder likewise will keep this data to interpret the matches the encoder refers to).

During LZ77 compression, bit patterns of a preceding (earlier or older) portion of a bit stream may be compared against a current portion (or current bit sequence) of the bit stream. If a sequence of bits is found in the current portion that matches a sequence of bits in the preceding portion (or preceding bit sequence), the sequence of bits in the current portion is replaced with a reference to the same sequence of bits in the earlier portion.

The reference that is inserted for the current bit sequence identifies the length of the current bit sequence and the location of the preceding bit sequence expressed, for instance, as a "distance" from the current bit sequence to the matching preceding bit sequence. As such, the LZ77 compression process encodes a bit sequence as a "length, distance pair" that is inserted in the bit stream in place of a current bit sequence. Upon decoding the compressed stream, when the decoder reaches the length, distance pair that is embedded in the bit stream, the decoder uses the distance part of the length, distance pair to refer back to the start of the matching bit sequence and reproduces the correct bit sequence of the decoded stream by reproducing a number of bits from the start of the matching bit sequence that is equal to the length component of the length, distance pair.

A non-limiting example of an LZ77 compression process may be performed on the following illustrative sequence, recited in a form prior to compression as: "AAAA BBBB CC DDD EEEE BBBB FFFF." During compression, the LZ77 compression process may locate the match "BBBB," having a length of 6 (including spaces). The matching "BBBB" sequences have a match offset (for instance, an intervening distance) of 17. The compressed sentence may be in the following form: "AAAA BBBB CC DDD EEEE@(6,17)FFFF," with "(6,17)" representing the length and distance pair associated with the BBBB match.

The Deflate compression process is used as the bases of various compression platforms, such as gzip/Zlib and Winzip/PKzip. In general, Deflate uses a series of blocks corresponding to successive blocks of input data. Each block may be compressed using a combination of the LZ77 compression process and Huffman coding. As described above, the LZ77 compression process operates to find repeated substrings and replaces the repeated substrings with references, such as relative distance offsets. The LZ77 compression process may use a reference to a duplicated string occurring in the same block or previous blocks, for instance, up to 32 KB previous input bytes. The compressed data may include a series of elements of two types: literal bytes and pointers to replicated strings (for instance, which may be represented as the pair: <length, backward distance>). The LZ77 compression process operates to find string matches at each position.

In many systems, decompression latencies may be critical to system performance and user experience. In general, conventional decompression may include sequential processes of decoding symbols in the compressed data stream. For example, the process of decompressing LZ77 streams has the following two phases: (1) decoding the input stream into tokens (literals or references to repeated strings) and (2) copying either the literal bytes or repeated strings (for example, with specified length and offset) to the output stream. The tokens may be in a highly compressed bit-stream using entropy-encoding (for example, Deflate) or in simpler packaging methods such as LZF, Snappy, LZ4, and/or the like. In conventional formats, each token is typically of a variable size, making it impossible to know for sure where a subsequent token is without decoding and processing the first token.

Corruption of compressed data may cause large portion of a compressed data stream to be unusable to a data consumer as the decompression process is not able to properly decompress the corrupt data. Because compressed data uses bits involving relative data (for instance, relative distance between a symbol and a literal) and absolute values (for instance, length of a literal), even a 1-bit error may corrupt a large portion of a compressed data stream. Conventional approaches to preventing such corruption generally involve decompressing the compressed data stream to verify that it matches the original data, for example, before the compressed data is stored or otherwise committed permanently. Although various approaches may be used to improve compression performance, because verification requires decompression, performance ultimately becomes limited by the efficiency of the decompression process (for instance, the speed of a decompression parser which is performing an inherently sequential process). Accordingly, in some embodiments, a compression process may include the use of a plurality of parallel decoders operating in a compression-verification process. In various embodiments, a compression encoder may generate compressed data based on source data and may also generate compression information that includes indicator information associated with the compressed data. In some embodiments, the indicator information may indicate information associated with the symbols within the compressed data. In some embodiments, the indicator information may include information indicating a starting position of the symbols within the compressed data. In various embodiments, the compression encoder may provide a compressed data stream of compressed data and a compressed information stream of indicator information to a decompression module. A decompression parser of the decompression module may divide up the compressed data into segments based on the indicator information. For instance, the decompression parser may divide of the compressed data into a plurality of segments each including one or more symbols and provide the plurality of segments to a plurality of decompression decoders. Each of the plurality of decompression decoders may decode the symbol(s) received in a segment in parallel (for example, simultaneously or substantially simultaneously). The plurality of decompression decoders may verify that the information associated with the decoded symbol (for instance, symbols size) matches the indicator information.

Various embodiments may comprise one or more elements. An element may comprise any structure arranged to perform certain operations. Each element may be implemented as hardware, software, firmware, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

FIG. 1 illustrates an example of an operating environment 100 that may be representative of various embodiments. The operating environment 100 depicted in FIG. 1 may include an apparatus 105 having a processor circuit 110, a memory unit 115, and a transceiver 120. Processor circuit 110 may include and or may access logic having instructions for performing operations according to some embodiments. Processor circuit 110 may be communicatively coupled to memory unit 115 and/or transceiver 120.

As shown in FIG. 1, apparatus 105 may include a compression module 130. In various embodiments, compression module 130 may include or be disposed within a processor circuit, such as processor circuit 110, a system-on-a-chip (SoC), a field-programmable gate array (FPGA), and/or the like. In some embodiments, compression module 130 may include a processor circuit. In some embodiments, compression module 130 may be implemented in software, firmware, hardware, or any combination thereof. In various embodiments, compression module 130 may be implemented in hardware configured to execute software, firmware, and/or the like to perform operations according to some embodiments.

Compression module 130 may include a data input interface 132 configured to access data, for example, to be compressed via compression module 130 (for instance, "uncompressed data"). Data input interface 132 may receive data input from various sources, including software applications or threads, hardware elements, data buffers, and/or the like. In various embodiments, the uncompressed data in the form of a data sequence or stream may be received or otherwise accessed by compression module 130 via data input interface 132. A data buffer 136 may be used to store data, such as intermediate data, data waiting to be compressed, compressed data waiting to be transmitted, and/or the like. Furthermore, compression module 130 may output a compressed data stream generated by compression module 130, for instance, to a data consumer and/or other components of apparatus 105.

In some embodiments, compression module 130 may include a compression component 134. In some embodiments, compression component 134 may be implemented in hardware, software, firmware, or any combination thereof. In various embodiments, compression component 134 may include one or more of a compression engine, encoder, algorithm, process, software application, firmware application, processor, co-processor, FPGA, and/or the like. In some embodiments, compression component 134 may include a plurality of instances of a single compression component or encoder. Compression component 134 may include various numbers of compression components (or instances of compression components).

In general, compression component 134 may be configured to generate compressed data by encoding or otherwise compressing source data received, for instance, through data input interface 132 using one or more compression processes (for example, compression, decompression, recompression, encoding, decoding, and/or the like). Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like. Although LZ77 and Deflate are used as examples, embodiments are not so limited. In particular, other or additional compression processes capable of operating according to some embodiments are contemplated herein.

In some embodiments, compression module 130 may include compression information component 138 operative to generate compression information. Non-limiting examples of compression information may include indicator information such as symbol information, symbol length, symbol locations, a number of compression encoders participating in a compression process, compression offset(s), skip values, compression level, compression type, and/or the like. In some embodiments, compression information component 138 may operate to generate compression information that includes indicator information indicating a location of symbols in compressed data generated by compression component 134.

In some embodiments, compression component 134 may employ LZ77 compression. In some embodiments, compression component 134 may employ Deflate compression. In various embodiments, compression module may provide compressed data generated by compression component 134 and/or compression information generated by compression information component 138 to data consumers and/or other components of apparatus 105.

Apparatus 105 may include a decompression module 140. In various embodiments, decompression module 140 may be implemented in software, for example, executed via processor circuit 110. In some embodiments, decompression module 140 may include or be disposed within a processor circuit, such as processor circuit 110, a system-on-a-chip (SoC), a field-programmable gate array (FPGA), and/or the like. In some embodiments, decompression module 140 may include a processor circuit. In some embodiments, decompression module 140 may be implemented in software, firmware, hardware, or any combination thereof. In various embodiments, decompression module 140 may be implemented at least partially in hardware configured to execute software, firmware, and/or the like for performing at least a portion of operations according to some embodiments.

Decompression module 140 may be operative to receive or otherwise access data, for example, to be decompressed via decoding component 146 (for instance, "compressed data," "compressed files," "compressed data streams," "zip files," "encoded data," and/or the like). For instance, decompression module 140 may receive data input from various sources, including compression module 130 and components thereof, software applications or threads, hardware elements, data buffers, and/or the like. A data buffer 142 may be used to store data, such as intermediate data, data structures, data waiting to be decompressed, decompressed data waiting to be transmitted, compression information, portions thereof, and/or the like.

Decoding component 144 may be operative to generate decompressed data by decompression compressed data received from compression module (for instance, from compression component 134). In some embodiments, decoding component 144 may include one or more decompression decoders to perform a decompression process such as an Inflate or other LZ77-type decompression process. In some embodiments, decoding component 144 may include a plurality of decoders. In some embodiments, decoding component 144 may include a plurality of decoders configured to operate in parallel or substantially in parallel. In some embodiments, decoding component 144 may include one or more parsers. In some embodiments, decompression decoders may operate to provide compressed data to one or more parsers as a plurality of segments divided based on compression information. One or more parsers may parse or otherwise process the plurality of segments to generate the corresponding symbols.

As shown in FIG. 1, apparatus may include a verification module 150 having a verification component 152. In some embodiments, decompression module 140 may include verification module 150. In various embodiments, verification module 150 may be implemented in software, for example, executed via processor circuit 110. In some embodiments, verification module 150 may include or be disposed within a processor circuit, such as processor circuit 110, a system-on-a-chip (SoC), a field-programmable gate array (FPGA), and/or the like. In some embodiments, verification module 150 may include a processor circuit. In some embodiments, verification module 150 may be implemented in software, firmware, hardware, or any combination thereof. In various embodiments, verification module 150 may be implemented at least partially in hardware configured to execute software, firmware, and/or the like for performing at least a portion of operations according to some embodiments.

In various embodiments, verification component 152 may be configured to verify a compressed data stream and/or decompressed data obtained via decompression of a compressed data stream. In some embodiments, verification component 152 may verify that characteristics of decompressed data matches or otherwise corresponds with compression information associated with compressed data decompressed to generate the decompressed data. In some embodiments, the characteristics may include a symbol size of the decompressed data. For instance, verification component 152 may operate to verify that decoded symbol size matches or is otherwise consistent with the compression information, such as location hints provided in the compression information. If verification component 152 determines that the decompressed data does not match or otherwise correspond with the compression information, verification component 152 may cause an alert to be generated. The alert may indicate that there may be errors in the compressed data and/or corresponding compressed data that may, for instance, cause corrupted data.

Figure 2:
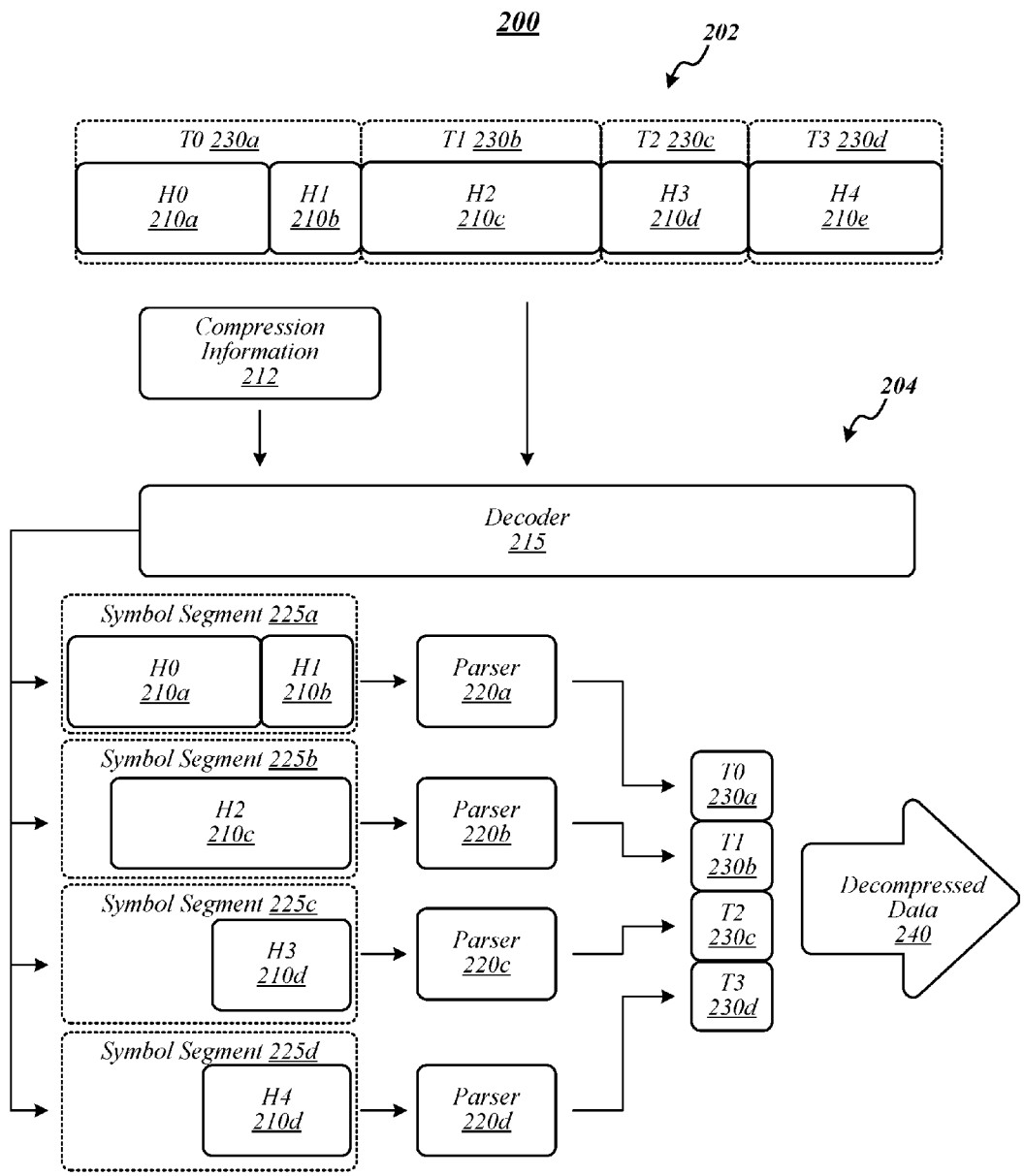
FIG. 2 illustrates an embodiment of a second operating environment.

FIG. 2 illustrates an example of an operating environment 200 that may be representative of various embodiments. The operating environment 200 depicted in FIG. 2 may include a decompression component 204 operative to decompress or decode compressed data 202. In some embodiments, decompression component 204 may include a decoder 215 and/or parsers 220*a-d* (for instance, symbol parsers). As shown in FIG. 2, compressed data 202 may include symbols T0-T1 230*a-n* that have been encoded, for instance, using Huffman codes, as H0-H4 210*a-e* to generate a compressed bit stream. In some embodiments, compression information 212 may be generated that corresponds with compressed data 202. In various embodiments, compression information 212 may include indicator information indicating the locations and/or sizes of symbols associated with compressed data 202 (for instance, symbols encoded by and/or generated during the compression process used to create compressed data 202). In some embodiments, compressed data 202 may include indicator information that includes a hint stream of a location and/or size of every or substantially every symbol of compressed data 202.

Decoder 215 may receive or otherwise access compressed data 202 and/or compression information 212. In some embodiments, decoder 215 may divide compressed data 202 or at least a portion of compressed data 202 into a plurality of symbol segments 225*a-d* based on indicator information of compression information 212, a number of elements of decompression component 204, and/or an offset. For instance, decompression component 204 may include parsers 220*a-d*. Accordingly, decoder 215 may segment compressed data 202 into symbol segments 225*a-d*, sending parser 220*a* bits corresponding to symbols 0, 4, 8, . . . , n, parser 220*b* bits corresponding to symbols 1, 5, 9, . . . , m, parser 220*c* bits corresponding to symbols 2, 6, 10, . . . , o, parser 220*d* bits corresponding to symbols 3, 7, 11, p, and so forth. Accordingly, decompression module 204 may operate on compressed data 202 in parallel. Thus, the throughput of decompression component 204 may be increased, for example, by a factor associated with the number of parsers 220*a-d* compared with conventional serial parsers. For instance, the throughput of decompression module 204 may be quadrupled in comparison with conventional serial decompression techniques due to the parallel operation of the four parsers 220*a-d*.

In some embodiments, in order to reduce or eliminate buffering for the compression information 212 (or hint stream), a compression component (or encoder) generating compressed data 202 and compression information 212 may only generate compression information 212 that includes starting positions at specific intervals (a "compression information interval"), such as at every $N^{th}$ interval. In this manner, any buffering required for the compression information 112 at the expense of, for instance, increasing decoder latency, increasing an amount of symbol buffer, and/or the like, may be reduced. In such embodiments, N may be set to 2, 4, 6, 8, 10, 16, 32, or any value between any two of these values. In some embodiments, N may be 16. In such an embodiment, for instance, parser 220*a* may decode symbols 0-15, parser 220*b* may decode symbols 16-31, and so on. In various embodiments, more symbols may need to be buffered at the output of parsers 220*a-d* so that later stages may be able to operate on parsed symbols in order.

In some embodiments, a fixed number or range of symbols may be provided to decoder 215. For example, a fixed number or range of symbols 230*a-d* may be provided to decoder 215 in compressed data 202. In another example, a fixed number or range of symbol segments 225*a-d* may be provided to one or more of parsers 220*a-d*. In various embodiments, instead of providing a fixed number or range of symbols 230*a-d* and/or symbol segments 225*a-d*, a fixed amount or range of data bits (for example, of compressed data 202) may be provided to decoder 215 such that the decoder 215 may generate a varying number of symbols 230*a-d*.

In various embodiments, compression information 212, including, for instance, indicator information, may be provided (for instance, by compression information component 138) for every or substantially every symbol 230*a-d* of compressed data 202. In some embodiments, compression information 212 may not be provided for every symbol 230*a-d* of compressed data 202. For instance, a "reduced hint process" may include providing compression information 212 for symbols 230*a-d* based on one or more selection factors, such as a symbol type (for example, literal symbols). In this manner, a compression process and/or a decompression process according to some embodiments may be faster or otherwise more efficient, for instance, when needed to reduce or minimize a number of compression indicators (or hints) in compression information 212. In such embodiments, references may be decoded at an acceptable speed with reduced risk and may also generate many literal bytes per decode. In some embodiments, a reduced hint process may be done based on length, literals, and/or distances.

In some embodiments, each parser 220a-d may be provided with a certain units of data, such as a word (for example, 16 bits), a dword (for example, 32 bits), and/or a qword (for example, 64 bits). In some embodiments, one or more of parsers 220a-d may be provided with a qword. In some embodiments, one or more of parsers 220a-d may be provided with a qword and a following qword so that, for instance, a final symbol of a primary qword may be decoded (as the qword may generally "straddle"). In such embodiments, one or more of parsers 220a-d may output a variable number of symbols 230a-b into its output symbol buffer (not shown) (for instance, a number of symbols that fits into a primary qword). For instance, for a four-way parallel configuration using four parallel parsers 220a-d, for an input bit-stream arranged as an array of qwords[ ], parsers 220a-d may receive data according to the following: parser 220a may receive Q[0], q[1]; parser 220b may receive Q[1], q[2]; parser 220c may receive Q[2], q[3]; and parser 220d may receive Q[3], q[4].

In some embodiments, compressed data 202 may be formed of multiple elements, such as blocks, segments, and/or the like. In some embodiments, compressed data 202 may include a Deflate compressed stream comprised of multiple blocks. In general, each block may be encoded with a Huffman code (for instance, a dynamic Huffman code) that may be transmitted before the symbols of that block. There may be a specific code for certain types of blocks, such as end-of-block (EOB), a bit in the Deflate header that specifies whether a block is a final block, and/or the like. Accordingly, decompression component 204 may receive compressed data 202 in the form of a compressed data stream having an arbitrary number of concatenated blocks. Thus, various embodiments may operate to handle the decoding of symbols after an EOB of a non-final block (for instance, when there is another block following a block with an EOB code.

Accordingly, in some embodiments, compression information 212 may be provided by a compressor (for instance, compression module 130) to include bit offsets for one or more symbols 230a-d. In various embodiments, compression information 212 may include an addition stream that includes bit offsets for the start of each Deflate block.

In various embodiments, a compressor may provide compression information 212 as a hint stream that includes bit offsets for every or substantially every symbol 230a-d. In such embodiments, compressor may operate according to one or more modes to determine when to provide a new block and/or whether blocks can be processed in parallel. For example, a compressor may determine whether a bit offset difference between consecutive symbols 230a-d is greater than and/or is greater than or equal to an offset threshold. In such an example, if the bit offset difference between consecutive symbols 230a-d is greater than and/or is greater than or equal to the offset threshold, the new symbol 230a-d may belong to a new black and/or cannot be processed in parallel. The offset threshold may include various values, such as 2, 4, 6, 8, 10, 12, 14, 16, 18, 20, 22, 24, 26, 28, 30, 40, 50, 100, or any value or range between any two of these values (including endpoints). In some embodiments, the offset threshold may be 28. Accordingly, when the last symbol is decoded, decompression component 204 may expect the last symbol to be EOB and may construct a new table for the (dynamic) Huffman codes of the new block, and decoding may resume.

Figure 3:
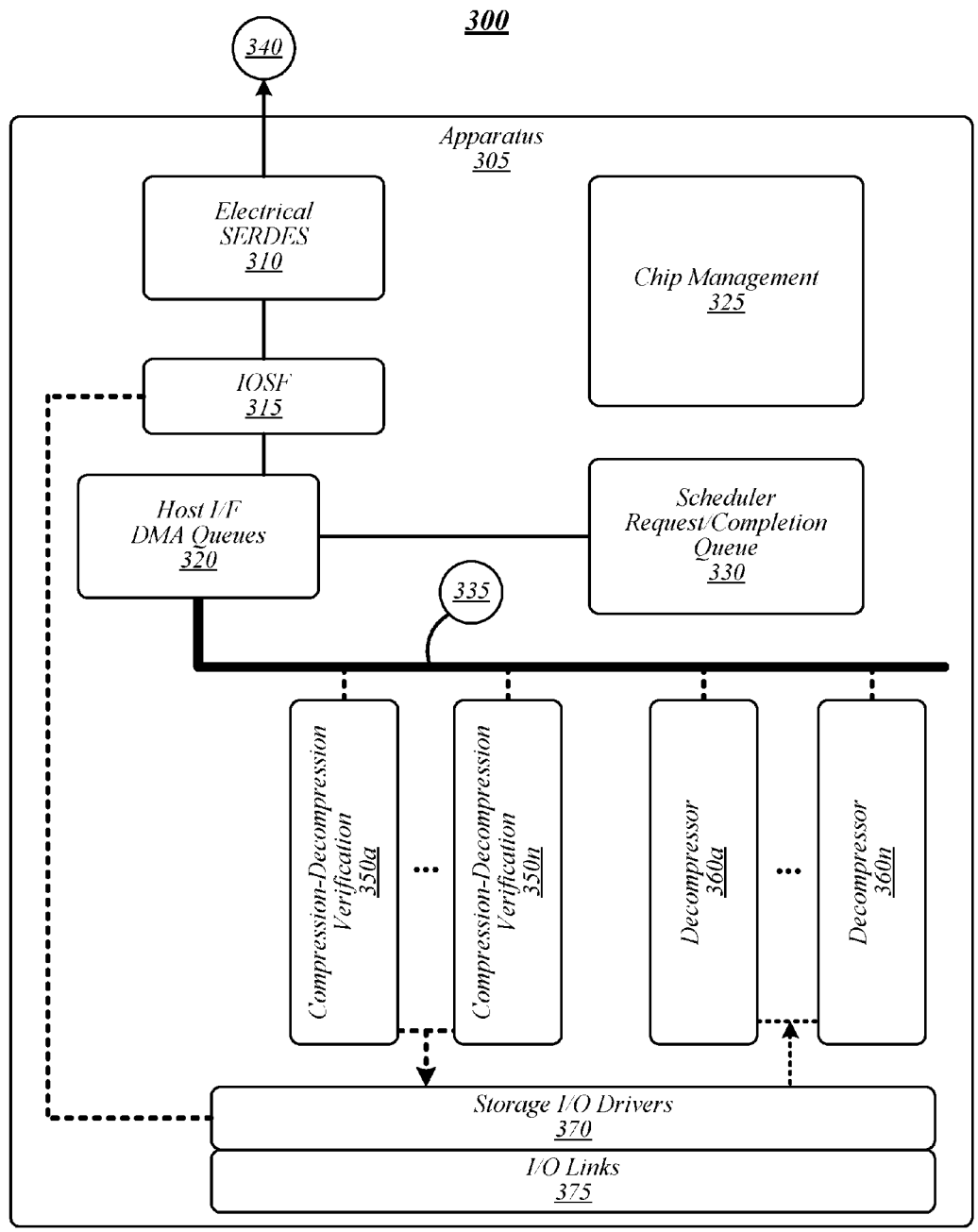
FIG. 3 illustrates an embodiment of a third operating environment.

FIG. 3 illustrates an example of an operating environment 300 that may be representative of various embodiments. The operating environment 300 depicted in FIG. 3 may include an apparatus 305 having a chip management 325 component, a chip system fabric 315 (for example, an Intel® on-chip system fabric (IOSF)), an interconnect 310 (for example, an electrical serializer/deserializer (SERDES)) communicatively coupled with a peripheral device 340 (for example, a component interconnect (PCI) express (PCIe) device), storage input/output (I/O) drivers 370, and I/O links 375. A bus 335 may operably connect compression-decompression verification components 350a-n and/or decompression components 360a-n to host interface (I/F) direct memory access (DMA) queues 370. In some embodiments, host I/F direct memory access (DMA) queues 370 may be operably coupled with a scheduler request/completion queue 330.

As shown in FIG. 3, write data flow in operating environment 300 may be indicated by the dashed lines. In some embodiments, write data flow may operate with a compressor followed by a decompressor 360a-n with hints and a compression-decompression verification component (or "verifying unit") 350a-n. In some embodiments, compression-decompression verification components 350a-n may operate by checking for equality in the decompressed output byte-by-byte with the original input using the compression information (for example, using a direct or byte-by-byte comparison), and/or use of checksum, cyclic redundancy check (CRC), and/or digest process. In some embodiments, a read data flow may include decompressors 360a-n without the use of compression information hints.

In some embodiments, compression-decompression verification components 350a-n may include a decompression component that is separate from decompressor 360a-n. Accordingly, in some embodiments, decompressor 360a-n may be used to perform reads/writes, while the decompressor (a "verification decompressor") of compression-decompression verification components 350a-n may be used for verification purposes. In various embodiments, verification decompressor and decompressors 360a-n may share certain elements, such as logic and/or decompression algorithms. For instance, verification decompressor and decompressors 360a-n may share logic such as tree decoder logic, basic parser/decoder functions, back-end LZ77 copy logic, history buffers, and/or the like. In some embodiments, a difference or the only difference between verification decompressor and decompressors 360a-n may be that the verification decompressor in the write data flow may include a set of parsers and, therefore, a different logic may provide data to the verification decompressor(s) and checks that the hint stream matches the decoded lengths of the symbols.

Figure 4:
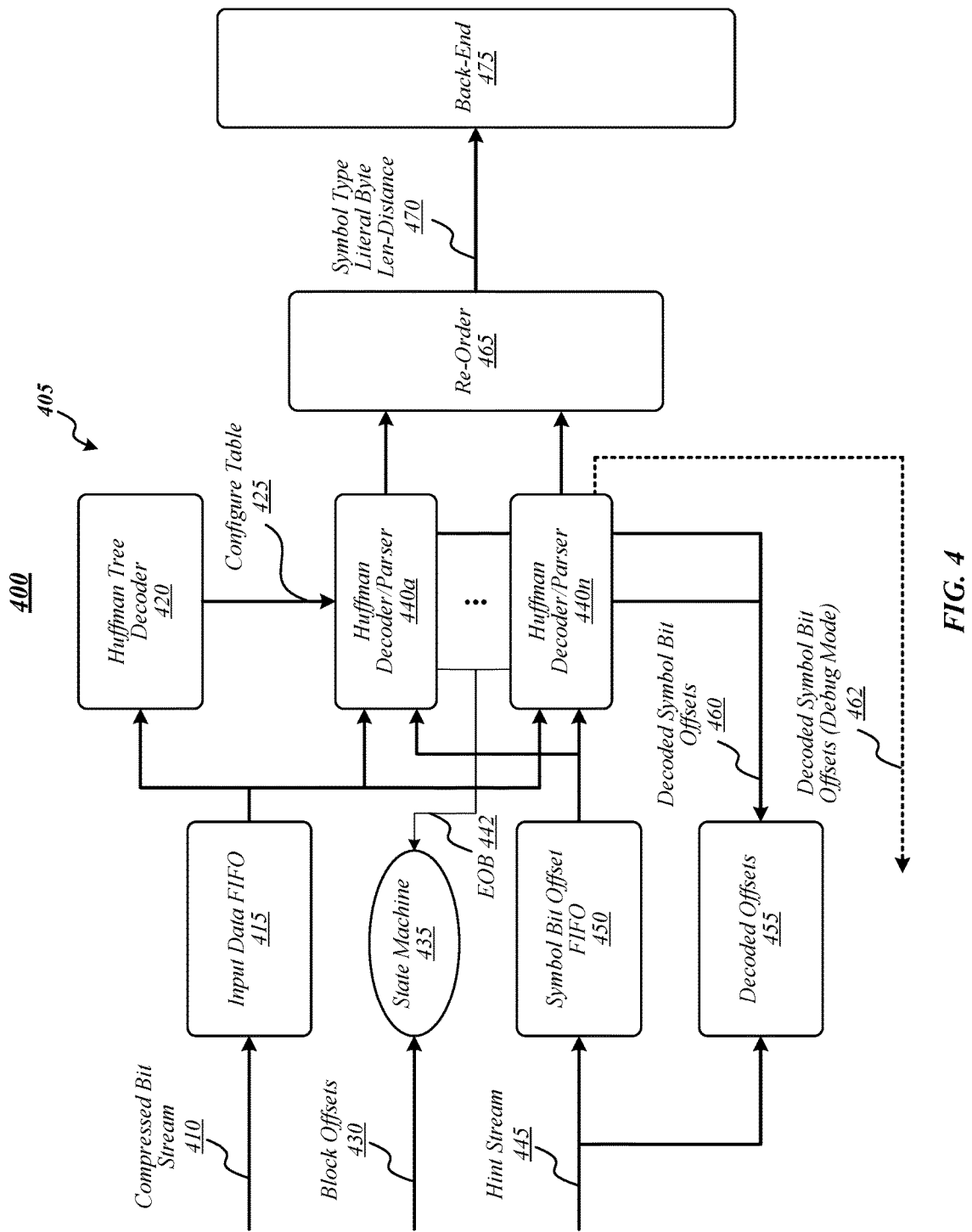
FIG. 4 illustrates an embodiment of a fourth operating environment.

FIG. 4 illustrates an example of an operating environment 400 that may be representative of various embodiments. The operating environment 400 depicted in FIG. 4 may include a decompressor 405 having a Huffman tree decoder 420 operative to provide configure tables 425 (for instance, of Huffman trees) to Huffman decoders/parsers 440a-n. Although Huffman-based elements are used as examples, such as in FIG. 4, embodiments are not so limited as other decoders and parsers capable of operating according to some embodiments are contemplated herein.

As shown in FIG. 4, a compressed bit stream 410 may be received by decompressor 405 at an input data first-in first-out FIFO 415. Block offsets 430 may be provided to a state machine 435 configured to receive an EOB 442 signal or other indicator from Huffman decoders/parsers 440a-n. A hint stream 445 may be provided to one or both of a symbol bit offset (hint) FIFO 450 and a decoded offsets 455 component. In addition, decoded symbol bit offsets 460 may be provided to decoded offsets 455. Output from Huffman decoders/parsers 440a-n may be provided to a re-order 465 component. Decompressed data information 470 (for instance, symbol type, literal byte, length-distance, and/or the like) may be provided to an LZ77 copy back end (for instance, with a (32 KB) history buffer memory) 475. As shown in FIG. 4, Huffman decoders/parsers 440a-n may operate on compressed bit stream 410 in a first usage (or mode) and hint stream 445 in a second usage (or mode).

In various embodiments, decoded offsets 455 component may operate in combination with Huffman decoders/parsers 440a-n to provide a verification process. For instance, decoded offsets 455 may compare compression information in hint stream 445 with decoded symbol bit offsets 460 obtained via decompressing compressed bit stream 410. If compression information of hint stream 445 matches or substantially matches (for instance, is within a matching threshold) of decoded symbol bit offsets 460, compressed bit stream 410 may be determined to be non-corrupt or substantially non-corrupt. Otherwise, if compression information of hint stream 445 does not match or substantially does not match (for instance, is outside of a matching threshold) of decoded symbol bit offsets 460, compressed bit stream 410 may be determined to be corrupt or substantially corrupt. In some embodiments, matching threshold may include a maximum number of non-matches, for instance, per symbol or some other duration. If compressed bit stream 410 is determined to be corrupt or substantially corrupt, decompressor 405 may trigger an alert (for example, a "corruption alert") or other type of signal to indicate the corrupt status of compressed bit stream 410.

In certain embodiments, a different decompressor (or different decoder and/or parser) may be used to read compressed data compared to the decompressor (or decoder and/or parser) used to perform the verification process. Accordingly, under certain conditions, a corrupt bit stream may not be able to be decompressed, except by the decompressor unit used in the compress pipeline. For instance, a corrupted compressed stream that has been stored may only be decompressed by the decompression component in the write pipeline. However, since the verification unit needs hints from the compressor, the verify unit cannot be used directly for reading a compressed stream that has been stored when the original data is not available.

Accordingly, in some embodiments decompressor 405 may be configured to operate in a debug mode. In some embodiments, decompressor 405 may operate in debug mode using only input data FIFO 415, Huffman tree decoder 420, Huffman decoders/parser 440a-n (for instance, one Huffman decoder/parser 440a-n), state machine 435, and LZ77 copy back-end 475.

In some embodiments, a decompression process may operate using debug information. For instance, a decompression engine (such as Huffman decoder/parser 440a-n) may generate a stream of debug mode decoded symbol bit offsets ("debug mode stream" or "debug information") 462, for instance, that includes every or substantially every bit position of every decoded symbol. In various embodiments, debug mode stream 462 may include bits offsets of every or substantially every Deflate block. In some embodiments, decompressor 405 operating in debug mode may ignore alerts (such as corruption alerts) in the back-end 475 and continue decompressing compressed bit stream 410.

In various embodiments debug mode stream 462 from the decompress read pipeline may be used to construct (or reconstruct) hint stream 445 (a "reconstructed hint stream" or "reconstructed compression information"), for example, used by the write pipeline. In some embodiments, the write pipeline of decompressor 405 may receive compressed bit stream 410 and constructed hint stream 445 directly into a decompress-verify unit. For example, the data being decompressed may be extracted, instead of being verified and discarded. The decompressor may directly receive the data being decompressed, bypassing the compressor. The data generated by bypassing the decompress-verify unit may be recorded. In some embodiments, if all of the data of a corrupt compressed data stream is not recovered in a single pass, multiple passes may be attempted to retrieve successive portions of a file.

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 5:
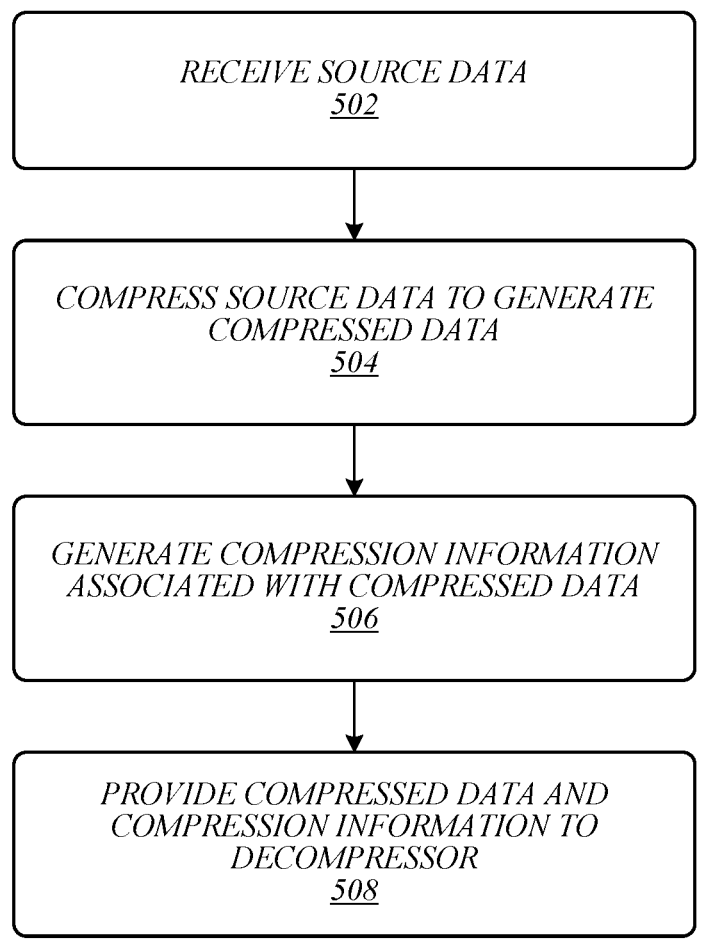
FIG. 5 illustrates an embodiment of a first logic flow.

FIG. 5 illustrates an embodiment of a logic flow 500. The logic flow 500 may be representative of some or all of the operations executed by one or more embodiments described herein, such as apparatus 105 and 305 and/or decompressors 204 and 405. In some embodiments, logic flow 500 may be representative of some or all of the operations of a compression process operative to provide for subsequent verification of the results of the compression process.

In the illustrated embodiment shown in FIG. 5, logic flow 500 at block 502 may receive source data. For example, compression module 130 may receive or otherwise access uncompressed source data via data input interface 132. In some embodiments, source data may include a data file, data stream, or other type of data construct. In various embodiments, source data may be stored in a storage device, such as a hard drive or memory device, on a computing device or within a cloud computing environment. In various embodiments, source data may be received by compression module 130 over a communication connection, for instance, via transceiver 120.

At block 504, logic flow 500 may compress source data to generate compressed data. For example, compression component 134 may generate compressed data by compressing the source data using a compression process, such as a Deflate compression process. Logic flow 500 may generate compression information associated with compressed data at block 506. For instance, compression information component 138 may operate to generate compression information that includes indicator information (or hints) indicating a location of symbols in compressed data generated by compression component 134. At block 508, logic flow 500 may provide the compressed data and the compression information to a decompressor. For example, compression component 134 may provide compressed data to decompression module 140 and compression information component 138 may provide compression information to decompression module 140. In another example, compressed bit stream 410 and hint stream 445 may be provided to decompressor 405.

Figure 6:
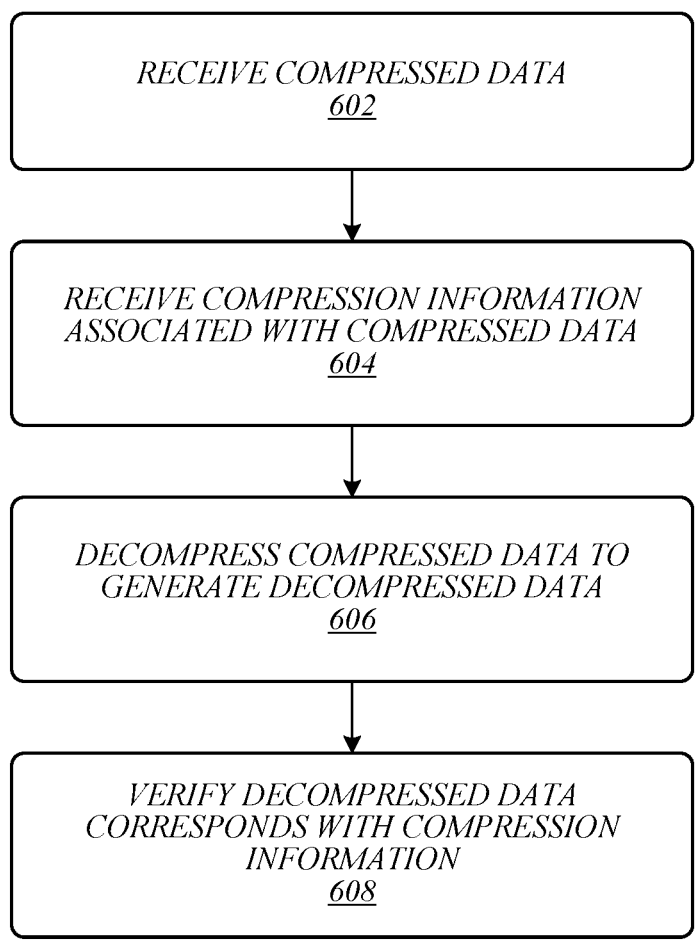
FIG. 6 illustrates an embodiment of a second logic flow.

FIG. 6 illustrates an embodiment of a logic flow 600. The logic flow 600 may be representative of some or all of the operations executed by one or more embodiments described herein, such as apparatus 105 and 305 and/or decompressors 204 and 405. In some embodiments, logic flow 600 may be representative of some or all of the operations of a compression process operative to provide for subsequent verification of the results of the compression process.

In the illustrated embodiment shown in FIG. 6, logic flow 600 at block 602 may receive compressed data. For example, decompression module 140 may receive or otherwise access compressed data from compression component 134. In another example, decompressors 360a-n may obtain compressed data from storage I/O drivers 370. At block 604, logic flow may receive compression information. For example, decompression module 140 may receive or otherwise access compression information from compression information component 138. In another example, hint stream 445 may be provided to decompressor 405.

At block 606, logic flow may decompress compressed data to generate decompressed data. For example, a compression-decompression verification component (or verifying unit) 350a-n may include a verification decompressor operative to decompress compressed data. Logic flow 600 may verify decompressed data corresponds with compression information at block 608. For example, decompression module 140, via a verification unit, may verify that the decoded symbol size is consistent with the indicator information (for example, symbol location hints) of the compression information. If the decoded symbol size is not consistent with the indicator information, the decompression module may generate an alert, such as an "error," "corrupt data," or "mis-compare" alert, indicating that a bit stream is not valid and/or that the compression information is not valid.

Figure 7:
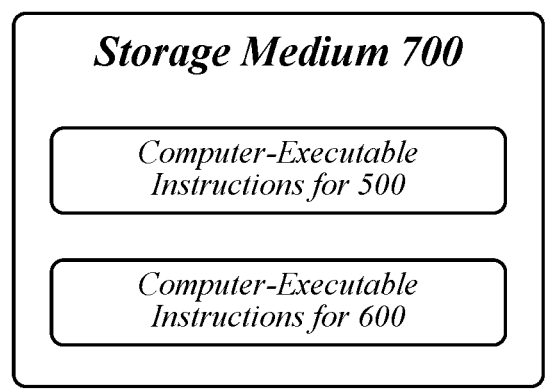
FIG. 7 illustrates an example of a storage medium.

FIG. 7 illustrates an example of a storage medium 700. Storage medium 700 may comprise an article of manufacture. In some examples, storage medium 700 may include any non-transitory computer readable medium or machine readable medium, such as an optical, magnetic or semiconductor storage. Storage medium 700 may store various types of computer executable instructions, such as instructions to implement logic flow 500 and/or logic flow 600. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 8:
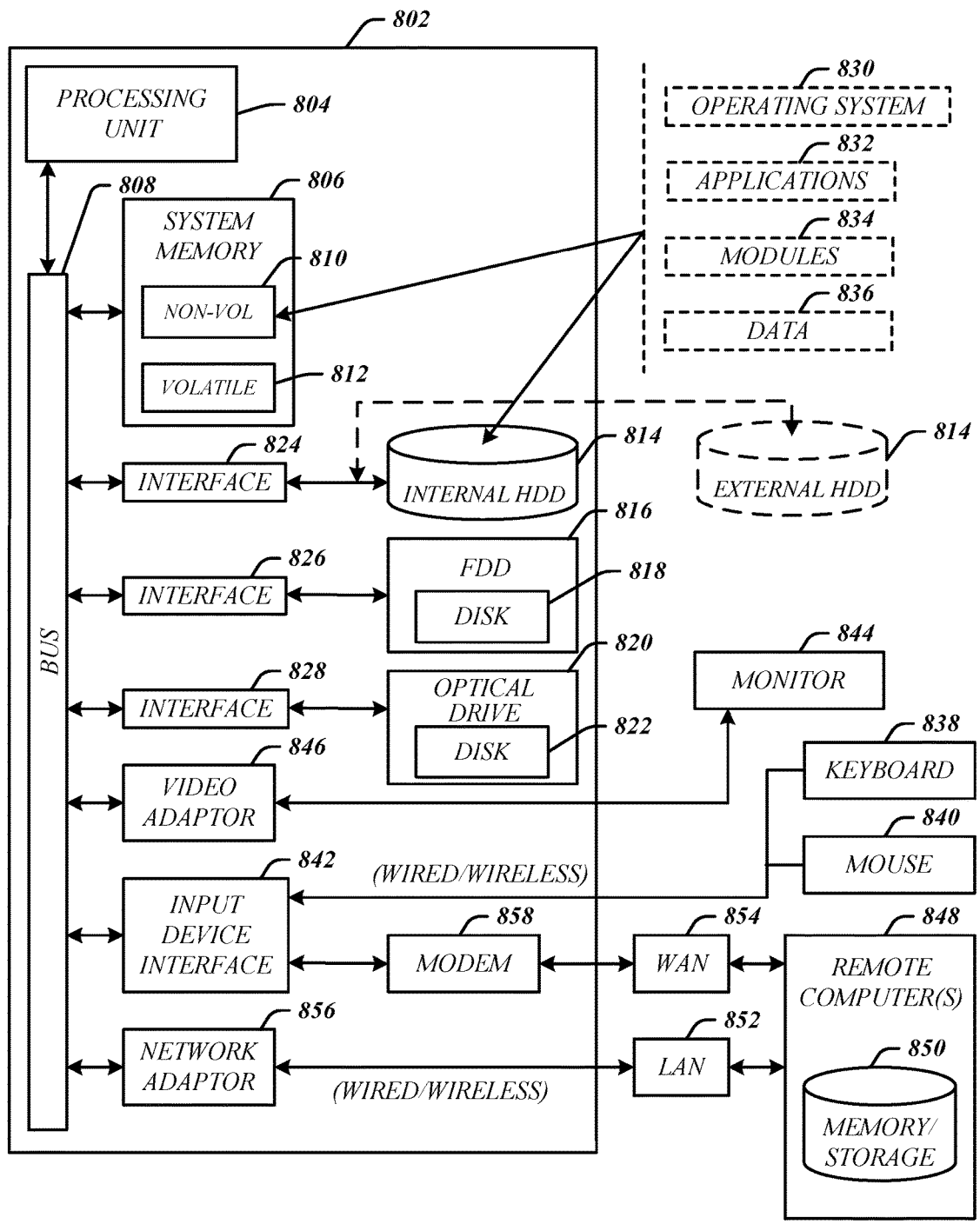
FIG. 8 illustrates an embodiment of a computing architecture.

FIG. 8 illustrates an embodiment of an exemplary computing architecture 800 suitable for implementing various embodiments as previously described. In various embodiments, the computing architecture 800 may comprise or be implemented as part of an electronic device. In some embodiments, the computing architecture 800 may be representative, for example, of apparatus 105, 205, 305, and/or 405. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 800. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 800 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 800.

As shown in FIG. 8, the computing architecture 800 comprises a processing unit 804, a system memory 806 and a system bus 808. The processing unit 804 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 804.

The system bus 808 provides an interface for system components including, but not limited to, the system memory 806 to the processing unit 804. The system bus 808 can be any of several types of bus structure that may further interconnect to a memory bus (with or without a memory controller), a peripheral bus, and a local bus using any of a variety of commercially available bus architectures. Interface adapters may connect to the system bus 808 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 806 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 8, the system memory 806 can include non-volatile memory 810 and/or volatile memory 812. A basic input/output system (BIOS) can be stored in the non-volatile memory 810.

The computer 802 may include various types of computer-readable storage media in the form of one or more lower speed memory units, including an internal (or external) hard disk drive (HDD) 814, a magnetic floppy disk drive (FDD) 816 to read from or write to a removable magnetic disk 818, and an optical disk drive 820 to read from or write to a removable optical disk 822 (e.g., a CD-ROM or DVD). The HDD 814, FDD 816 and optical disk drive 820 can be connected to the system bus 808 by a HDD interface 824, an FDD interface 826 and an optical drive interface 828, respectively. The HDD interface 824 for external drive implementations can include at least one or both of Universal Serial Bus (USB) and IEEE 1384 interface technologies.

The drives and associated computer-readable media provide volatile and/or nonvolatile storage of data, data structures, computer-executable instructions, and so forth. For example, a number of program modules can be stored in the drives and memory units 810, 812, including an operating system 830, one or more application programs 832, other program modules 834, and program data 836. In one embodiment, the one or more application programs 832, other program modules 834, and program data 836 can include, for example, the various applications and/or components of apparatus 105, 205, 305, and/or 405.

A user can enter commands and information into the computer 802 through one or more wire/wireless input devices, for example, a keyboard 838 and a pointing device, such as a mouse 840. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 804 through an input device interface 842 that is coupled to the system bus 808, but can be connected by other interfaces such as a parallel port, IEEE 1384 serial port, a game port, a USB port, an IR interface, and so forth.

A monitor 844 or other type of display device is also connected to the system bus 808 via an interface, such as a video adaptor 846. The monitor 844 may be internal or external to the computer 802. In addition to the monitor 844, a computer typically includes other peripheral output devices, such as speakers, printers, and so forth.

The computer 802 may operate in a networked environment using logical connections via wire and/or wireless communications to one or more remote computers, such as a remote computer 848. The remote computer 848 can be a workstation, a server computer, a router, a personal computer, portable computer, microprocessor-based entertainment appliance, a peer device or other common network node, and typically includes many or all of the elements described relative to the computer 802, although, for purposes of brevity, only a memory/storage device 850 is illustrated. The logical connections depicted include wire/wireless connectivity to a local area network (LAN) 852 and/or larger networks, for example, a wide area network (WAN) 854. Such LAN and WAN networking environments are commonplace in offices and companies, and facilitate enterprise-wide computer networks, such as intranets, all of which may connect to a global communications network, for example, the Internet.

When used in a LAN networking environment, the computer 802 is connected to the LAN 852 through a wire and/or wireless communication network interface or adaptor 856. The adaptor 856 can facilitate wire and/or wireless communications to the LAN 852, which may also include a wireless access point disposed thereon for communicating with the wireless functionality of the adaptor 856.

When used in a WAN networking environment, the computer 802 can include a modem 858, or is connected to a communications server on the WAN 854, or has other means for establishing communications over the WAN 854, such as by way of the Internet. The modem 858, which can be internal or external and a wire and/or wireless device, connects to the system bus 808 via the input device interface 842. In a networked environment, program modules depicted relative to the computer 802, or portions thereof, can be stored in the remote memory/storage device 850. It will be appreciated that the network connections shown are exemplary and other means of establishing a communications link between the computers can be used.

The computer 802 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following include non-limiting examples according to some embodiments:

Example 1 is an apparatus to verify compressed data, the apparatus comprising at least one memory, and logic, at least a portion of comprised in hardware coupled to the at least one memory, comprising access compressed data, access compression information associated with the compressed data, decompress at least a portion of the compressed data to generate decompressed data, and verify the compressed data via a comparison of the decompressed data with the compression information.

Example 2 is the apparatus of Example 1, the compression process comprising one of an LZ77 compression process or a Deflate compression process.

Example 3 is the apparatus of Example 1, the compression process comprising an LZ77 compression process.

Example 4 is the apparatus of Example 1, the compression process comprising a Deflate compression process.

Example 5 is the apparatus of Example 1, the logic to generate the decompressed data using at least one decompressor of a verification unit.

Example 6 is the apparatus of Example 1, the compression information comprising indicator information providing a length of symbols of the compressed data.

Example 7 is the apparatus of Example 1, the compression information comprising indicator information providing a location of symbols of the compressed data.

Example 8 is the apparatus of Example 1, the compression information comprising indicator information for every Nth symbol of the compressed data.

Example 9 is the apparatus of Example 1, the compression information comprising indicator information for each literal symbol of the compressed data.

Example 10 is the apparatus of Example 1, the logic to divide the compressed data into a plurality of symbol segments.

Example 11 is the apparatus of Example 1, the logic to divide the compressed data into a plurality of symbol segments based on at least one symbol location indicated by the compression information.

Example 12 is the apparatus of Example 1, the logic to divide the compressed data into a plurality of symbol segments, and provide the plurality of symbol segments to a plurality of decompressors to decompress the plurality of symbol segments in parallel.

Example 13 is the apparatus of Example 1, the logic to verify the compressed data by comparing at least one decompressed symbol size of the decompressed data with a corresponding symbol size of the compression information.

Example 14 is the apparatus of Example 1, the logic to verify the compressed data by comparing at least one decompressed symbol location of the decompressed data with a corresponding symbol location of the compression information.

Example 15 is the apparatus of Example 1, the logic comprising a plurality of parsers to decompress the at least a portion of the compressed data in parallel to generate the decompressed data.

Example 16 is the apparatus of Example 1, the logic comprising a plurality of parsers to decompress the compressed data, each of the plurality of parsers to receive an amount of data bits of the compressed data.

Example 17 is the apparatus of Example 1, the logic comprising a plurality of parsers to decompress the compressed data, each of the plurality of parsers to receive an amount of data bits of the compressed data, the amount of data bits comprising one of 16 bits, 32 bits, or 64 bits.

Example 18 is the apparatus of Example 1, the compression information comprising indicator information for symbols of the compressed data based on at least one selection factor.

Example 19 is the apparatus of Example 1, the compression information comprising indicator information for symbols of the compressed data based on at least one selection factor, the at least one selection factor comprising a symbol type.

Example 20 is the apparatus of Example 1, the compression information comprising an addition stream having at least one bit offset for each block of the compressed data.

Example 21 is the apparatus of Example 1, the logic to verify at least a portion of the decompressed data via a direct comparison of the decompressed data with the compressed data.

Example 22 is the apparatus of Example 1, the logic to verify at least a portion of the decompressed data via a byte-by-byte comparison of the decompressed data with the compressed data.

Example 23 is the apparatus of Example 1, the logic to generate debug information for the decompressed data.

Example 24 is the apparatus of Example 1, the logic to generate debug information for the decompressed data, the debug information comprising at least one bit position of at least one decoded symbol of decompressed data.

Example 25 is the apparatus of Example 1, the logic to generate debug information for the decompressed data, and generate reconstructed compression information based on the debug information.

Example 26 is the apparatus of Example 1, the logic to receive reconstructed compression information associated with the compressed data, and provide the decompressed data by bypassing the verification and extracting the decompressed data.

Example 27 is the apparatus of Example 1, the compression information generated during compression of the compressed data.

Example 28 is a system to verify compressed data, comprising the apparatus according to any of Examples 1-27, and at least one network interface.

Example 29 is a method to verify compressed data, the method comprising accessing compressed data, accessing compression information associated with the compressed data, decompressing at least a portion of the compressed data to generate decompressed data, and verifying the compressed data via a comparison of the decompressed data with the compression information.

Example 30 is the method of Example 29, the compression process comprising one of an LZ77 compression process or a Deflate compression process.

Example 31 is the method of Example 29, the compression process comprising an LZ77 compression process.

Example 32 is the method of Example 29, the compression process comprising a Deflate compression process.

Example 33 is the method of Example 29, comprising generating the decompressed data using at least one decompressor of a verification unit.

Example 34 is the method of Example 29, the compression information comprising indicator information providing a length of symbols of the compressed data.

Example 35 is the method of Example 29, the compression information comprising indicator information providing a location of symbols of the compressed data.

Example 36 is the method of Example 29, the compression information comprising indicator information for every Nth symbol of the compressed data.

Example 37 is the method of Example 29, the compression information comprising indicator information for each literal symbol of the compressed data.

Example 38 is the method of Example 29, comprising dividing the compressed data into a plurality of symbol segments.

Example 39 is the method of Example 29, comprising dividing the compressed data into a plurality of symbol segments based on at least one symbol location indicated by the compression information.

Example 40 is the method of Example 29, comprising dividing the compressed data into a plurality of symbol segments, and providing the plurality of symbol segments to a plurality of decompressors to decompress the plurality of symbol segments in parallel.

Example 41 is the method of Example 29, comprising verifying the compressed data by comparing at least one decompressed symbol size of the decompressed data with a corresponding symbol size of the compression information.

Example 42 is the method of Example 29, comprising verifying the compressed data by comparing at least one decompressed symbol location of the decompressed data with a corresponding symbol location of the compression information.

Example 43 is the method of Example 29, comprising decompressing the at least a portion of the compressed data via a plurality of parsers in parallel to generate the decompressed data.

Example 44 is the method of Example 29, comprising decompressing the at least a portion of the compressed data via a plurality of parsers, each of the plurality of parsers to receive an amount of data bits of the compressed data.

Example 45 is the method of Example 29, comprising decompressing the at least a portion of the compressed data via a plurality of parsers, each of the plurality of parsers to receive an amount of data bits of the compressed data, the amount of data bits comprising one of 16 bits, 32 bits, or 64 bits.

Example 46 is the method of Example 29, the compression information comprising indicator information for symbols of the compressed data based on at least one selection factor.

Example 47 is the method of Example 29, the compression information comprising indicator information for symbols of the compressed data based on at least one selection factor, the at least one selection factor comprising a symbol type.

Example 48 is the method of Example 29, the compression information comprising an addition stream having at least one bit offset for each block of the compressed data.

Example 49 is the method of Example 29, comprising verifying at least a portion of the decompressed data via a direct comparison of the decompressed data with the compressed data.

Example 50 is the method of Example 29, comprising verifying at least a portion of the decompressed data via a byte-by-byte comparison of the decompressed data with the compressed data.

Example 51 is the method of Example 29, comprising generating debug information for the decompressed data.

Example 52 is the method of Example 29, comprising generating debug information for the decompressed data, the debug information comprising at least one bit position of at least one decoded symbol of decompressed data.

Example 53 is the method of Example 29, comprising generating debug information for the decompressed data, and generating reconstructed compression information based on the debug information.

Example 54 is the method of Example 29, comprising receiving reconstructed compression information associated with the compressed data, and providing the decompressed data by bypassing the verification and extracting the decompressed data.

Example 55 is the method of Example 29, the compression information generated during compression of the compressed data.

Example 56 is a computer-readable storage medium, comprising a plurality of instructions to verify compressed data that, when executed, enable processing circuitry to access compressed data, access compression information associated with the compressed data, decompress at least a portion of the compressed data to generate decompressed data, and verify the compressed data via a comparison of the decompressed data with the compression information.

Example 57 is the computer-readable storage medium of Example 56, the compression process comprising one of an LZ77 compression process or a Deflate compression process.

Example 58 is the computer-readable storage medium of Example 56, the compression process comprising an LZ77 compression process.

Example 59 is the computer-readable storage medium of Example 56, the compression process comprising a Deflate compression process.

Example 60 is the computer-readable storage medium of Example 56, the plurality of instructions, when executed, enable the processing circuitry to generate the decompressed data using at least one decompressor of a verification unit.

Example 61 is the computer-readable storage medium of Example 56, the compression information comprising indicator information providing a length of symbols of the compressed data.

Example 62 is the computer-readable storage medium of Example 56, the compression information comprising indicator information providing a location of symbols of the compressed data.

Example 63 is the computer-readable storage medium of Example 56, the compression information comprising indicator information for every Nth symbol of the compressed data.

Example 64 is the computer-readable storage medium of Example 56, the compression information comprising indicator information for each literal symbol of the compressed data.

Example 65 is the computer-readable storage medium of Example 56, the plurality of instructions, when executed, enable the processing circuitry to divide the compressed data into a plurality of symbol segments.

Example 66 is the computer-readable storage medium of Example 56, the plurality of instructions, when executed, enable the processing circuitry to divide the compressed data into a plurality of symbol segments based on at least one symbol location indicated by the compression information.

Example 67 is the computer-readable storage medium of Example 56, the plurality of instructions, when executed, enable the processing circuitry to divide the compressed data into a plurality of symbol segments, and provide the plurality of symbol segments to a plurality of decompressors to decompress the plurality of symbol segments in parallel.

Example 68 is the computer-readable storage medium of Example 56, the plurality of instructions, when executed, enable the processing circuitry to verify the compressed data by comparing at least one decompressed symbol size of the decompressed data with a corresponding symbol size of the compression information.

Example 69 is the computer-readable storage medium of Example 56, the plurality of instructions, when executed, enable the processing circuitry to verify the compressed data by comparing at least one decompressed symbol location of the decompressed data with a corresponding symbol location of the compression information.

Example 70 is the computer-readable storage medium of Example 56, the plurality of instructions, when executed, enable the processing circuitry to decompress the at least a portion of the compressed data via a plurality of parsers in parallel to generate the decompressed data.

Example 71 is the computer-readable storage medium of Example 56, the plurality of instructions, when executed, enable the processing circuitry to decompress the at least a portion of the compressed data via a plurality of parsers, each of the plurality of parsers to receive an amount of data bits of the compressed data.

Example 72 is the computer-readable storage medium of Example 56, the plurality of instructions, when executed, enable the processing circuitry to decompress the at least a portion of the compressed data via a plurality of parsers, each of the plurality of parsers to receive an amount of data bits of the compressed data, the amount of data bits comprising one of 16 bits, 32 bits, or 64 bits.

Example 73 is the computer-readable storage medium of Example 56, the compression information comprising indicator information for symbols of the compressed data based on at least one selection factor.

Example 74 is the computer-readable storage medium of Example 56, the compression information comprising indicator information for symbols of the compressed data based on at least one selection factor, the at least one selection factor comprising a symbol type.

Example 75 is the computer-readable storage medium of Example 56, the compression information comprising an addition stream having at least one bit offset for each block of the compressed data.

Example 76 is the computer-readable storage medium of Example 56, the plurality of instructions, when executed, enable the processing circuitry to verify at least a portion of the decompressed data via a direct comparison of the decompressed data with the compressed data.

Example 77 is the computer-readable storage medium of Example 56, the plurality of instructions, when executed, enable the processing circuitry to verify at least a portion of the decompressed data via a byte-by-byte comparison of the decompressed data with the compressed data.

Example 78 is the computer-readable storage medium of Example 56, the plurality of instructions, when executed, enable the processing circuitry to generate debug information for the decompressed data.

Example 79 is the computer-readable storage medium of Example 56, the plurality of instructions, when executed, enable the processing circuitry to generate debug information for the decompressed data, the debug information comprising at least one bit position of at least one decoded symbol of decompressed data.

Example 80 is the computer-readable storage medium of Example 56, the plurality of instructions, when executed, enable the processing circuitry to generate debug information for the decompressed data, and generate reconstructed compression information based on the debug information.

Example 81 is the computer-readable storage medium of Example 56, the plurality of instructions, when executed, enable the processing circuitry to receive reconstructed compression information associated with the compressed data, and provide the decompressed data by bypassing the verification and extracting the decompressed data.

Example 82 is the computer-readable storage medium of Example 56, the compression information generated during compression of the compressed data.

Example 83 is an apparatus to verify compressed data, the apparatus comprising a compression information means to access compression information associated with compressed data, a decompression means to decompress at least a portion of the compressed data to generate decompressed data, and a verification means to verify the compressed data via a comparison of the decompressed data with the compression information.

Example 84 is the apparatus of Example 83, the compression process comprising one of an LZ77 compression process or a Deflate compression process.

Example 85 is the apparatus of Example 83, the compression process comprising an LZ77 compression process.

Example 86 is the apparatus of Example 83, the compression process comprising a Deflate compression process.

Example 87 is the apparatus of Example 83, the decompression means to generate the decompressed data using at least one decompressor of a verification unit.

Example 88 is the apparatus of Example 83, the compression information comprising indicator information providing a length of symbols of the compressed data.

Example 89 is the apparatus of Example 83, the compression information comprising indicator information providing a location of symbols of the compressed data.

Example 90 is the apparatus of Example 83, the compression information comprising indicator information for every Nth symbol of the compressed data.

Example 91 is the apparatus of Example 83, the compression information comprising indicator information for each literal symbol of the compressed data.

Example 92 is the apparatus of Example 83, the decompression means to divide the compressed data into a plurality of symbol segments.

Example 93 is the apparatus of Example 83, the decompression means to divide the compressed data into a plurality of symbol segments based on at least one symbol location indicated by the compression information.

Example 94 is the apparatus of Example 83, the decompression means to divide the compressed data into a plurality of symbol segments, and provide the plurality of symbol segments to a plurality of decompressors to decompress the plurality of symbol segments in parallel.

Example 95 is the apparatus of Example 83, the verification means to verify the compressed data by comparing at least one decompressed symbol size of the decompressed data with a corresponding symbol size of the compression information.

Example 96 is the apparatus of Example 83, the verification means to verify the compressed data by comparing at least one decompressed symbol location of the decompressed data with a corresponding symbol location of the compression information.

Example 97 is the apparatus of Example 83, the decompression means comprising a plurality of parsers to decompress the at least a portion of the compressed data in parallel to generate the decompressed data.

Example 98 is the apparatus of Example 83, the decompression means comprising a plurality of parsers to decompress the compressed data, each of the plurality of parsers to receive an amount of data bits of the compressed data.

Example 99 is the apparatus of Example 83, the decompression means comprising a plurality of parsers to decompress the compressed data, each of the plurality of parsers to receive an amount of data bits of the compressed data, the amount of data bits comprising one of 16 bits, 32 bits, or 64 bits.

Example 100 is the apparatus of Example 83, the compression information comprising indicator information for symbols of the compressed data based on at least one selection factor.

Example 101 is the apparatus of Example 83, the compression information comprising indicator information for symbols of the compressed data based on at least one selection factor, the at least one selection factor comprising a symbol type.

Example 102 is the apparatus of Example 83, the compression information comprising an addition stream having at least one bit offset for each block of the compressed data.

Example 103 is the apparatus of Example 83, the verification means to verify at least a portion of the decompressed data via a direct comparison of the decompressed data with the compressed data.

Example 104 is the apparatus of Example 83, the verification means to verify at least a portion of the decompressed data via a byte-by-byte comparison of the decompressed data with the compressed data.

Example 105 is the apparatus of Example 83, the decompression means to generate debug information for the decompressed data.

Example 106 is the apparatus of Example 83, the decompression means to generate debug information for the decompressed data, the debug information comprising at least one bit position of at least one decoded symbol of decompressed data.

Example 107 is the apparatus of Example 83, the decompression means to generate debug information for the decompressed data, and generate reconstructed compression information based on the debug information.

Example 108 is the apparatus of Example 83, the decompression means to receive reconstructed compression information associated with the compressed data, and provide the decompressed data by bypassing the verification and extracting the decompressed data.

Example 109 is the apparatus of Example 83, the compression information generated during compression of the compressed data.

Example 110 is a system to verify compressed data, comprising the apparatus according to any of Examples 83-109, and at least one network interface.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus to verify compressed data, the apparatus comprising:
at least one memory; and logic, at least a portion of comprised in hardware coupled to the at least one memory, comprising:
  access compressed data,
  access compression information associated with the compressed data,
  decompress at least a portion of the compressed data to generate decompressed data, and
  verify the compressed data via a comparison of the decompressed data with the compression information.

2. The apparatus of claim 1, the compressed data compressed based at least in part on one of an LZ77 compression process or a Deflate compression process.

3. The apparatus of claim 1, the compression information comprising indicator information providing a length of symbols of the compressed data.

4. The apparatus of claim 1, the compression information comprising indicator information providing a location of symbols of the compressed data.

5. The apparatus of claim 1, the logic to divide the compressed data into a plurality of symbol segments based on at least one symbol location indicated by the compression information.

6. The apparatus of claim 1, the logic to verify the compressed data by comparing at least one decompressed symbol size of the decompressed data with a corresponding symbol size of the compression information.

7. The apparatus of claim 1, the logic to verify the compressed data by comparing at least one decompressed symbol location of the decompressed data with a corresponding symbol location of the compression information.

8. The apparatus of claim 1, the logic to verify at least a portion of the decompressed data via a byte-by-byte comparison of the decompressed data with the compressed data.

9. The apparatus of claim 1, the logic to generate debug information for the decompressed data, the debug information comprising at least one bit position of at least one decoded symbol of decompressed data.

10. The apparatus of claim 1, the logic to:
  generate debug information for the decompressed data, and
  generate reconstructed compression information based on the debug information.

11. A method to verify compressed data, the method comprising:
  accessing compressed data;
  accessing compression information associated with the compressed data;
  decompressing at least a portion of the compressed data to generate decompressed data; and
  verifying the compressed data via a comparison of the decompressed data with the compression information.

12. The method of claim 11, the compression process comprising one of an LZ77 compression process or a Deflate compression process.

13. The method of claim 11, the compression information comprising indicator information providing a length of symbols of the compressed data.

14. The method of claim 11, the compression information comprising indicator information providing a location of symbols of the compressed data.

15. The method of claim 11, comprising dividing the compressed data into a plurality of symbol segments based on at least one symbol location indicated by the compression information.

16. The method of claim 11, comprising verifying the compressed data by comparing at least one decompressed symbol size of the decompressed data with a corresponding symbol size of the compression information.

17. The method of claim 11, comprising verifying the compressed data by comparing at least one decompressed symbol location of the decompressed data with a corresponding symbol location of the compression information.

18. The method of claim 11, comprising verifying at least a portion of the decompressed data via a byte-by-byte comparison of the decompressed data with the compressed data.

19. The method of claim 11, comprising generating debug information for the decompressed data, the debug information comprising at least one bit position of at least one decoded symbol of decompressed data.

20. The method of claim 11, comprising:
  generating debug information for the decompressed data; and
  generating reconstructed compression information based on the debug information.

21. A non-transitory computer-readable storage medium, comprising a plurality of instructions to verify compressed data that, when executed, enable processing circuitry to:
  access compressed data;
  access compression information associated with the compressed data;
  decompress at least a portion of the compressed data to generate decompressed data; and
  verify the compressed data via a comparison of the decompressed data with the compression information.

22. The non-transitory computer-readable storage medium of claim 21, the compression information comprising indicator information providing a length of symbols of the compressed data.

23. The non-transitory computer-readable storage medium of claim 21, the compression information comprising indicator information providing a location of symbols of the compressed data.

24. The non-transitory computer-readable storage medium of claim 21, the plurality of instructions, when executed, enable the processing circuitry to divide the compressed data into a plurality of symbol segments based on at least one symbol location indicated by the compression information.

25. The non-transitory computer-readable storage medium of claim 21, the plurality of instructions, when executed, enable the processing circuitry to decompress the at least a portion of the compressed data via a plurality of parsers in parallel to generate the decompressed data.

\* \* \* \* \*